United States Patent
Kroener et al.

(10) Patent No.: US 8,610,257 B2
(45) Date of Patent: Dec. 17, 2013

(54) SEMICONDUCTOR DEVICE AND METHOD FOR PRODUCING SUCH A DEVICE

(75) Inventors: Friedrich Kroener, Villach (AT);
Francisco Javier Santos Rodriguez, Villach (AT); Carsten von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 13/269,918

(22) Filed: Oct. 10, 2011

(65) Prior Publication Data
US 2012/0032295 A1 Feb. 9, 2012

Related U.S. Application Data

(62) Division of application No. 11/941,609, filed on Nov. 16, 2007, now Pat. No. 8,039,313.

(30) Foreign Application Priority Data

Nov. 17, 2006 (DE) .......... 10 2006 054 311

(51) Int. Cl.
| | |
|---|---|
| H01L 23/06 | (2006.01) |
| H01L 23/04 | (2006.01) |
| H01L 29/40 | (2006.01) |
| H01L 23/52 | (2006.01) |
| H01L 23/48 | (2006.01) |
| H01L 23/12 | (2006.01) |
| H01L 23/13 | (2006.01) |
| H01L 23/14 | (2006.01) |
| H01L 23/15 | (2006.01) |

(52) U.S. Cl.
USPC ........... 257/684; 257/690; 257/698; 257/774; 257/E23.003; 257/E23.004; 257/E23.005; 257/E23.006; 257/E23.007; 257/E23.008; 257/E23.009

(58) Field of Classification Search
USPC .......... 257/E23.003–E23.009, 684, 690, 698, 257/774
See application file for complete search history.

(56) References Cited

U.S. PATENT DOCUMENTS

4,784,970 A * 11/1988 Solomon ....................... 438/406
5,757,081 A 5/1998 Chang
(Continued)

FOREIGN PATENT DOCUMENTS

DE 19543893 2/1997

OTHER PUBLICATIONS

Office Action relative to U.S. Appl. No. 11/941,609 dated Sep. 17, 2009.
(Continued)

*Primary Examiner* — Phat X Cao
*Assistant Examiner* — Diana C Vieira
(74) *Attorney, Agent, or Firm* — Dicke, Billig & Czaja, PLLC

(57) ABSTRACT

A semiconductor device and method for producing such a device is disclosed. One embodiment provides a semiconductor functional wafer having a first and second main surface. Component production processes are performed for producing a component functional region at the first main surface, wherein the component production processes produce an end state that is stable up to at least a first temperature. A carrier substrate is fitted to the first main surface. Access openings are produced to the first main surface. At least one further component production process is performed for producing patterned component functional regions at the first main surface of the functional wafer in the access openings. The end state produced in this process is stable up to a second temperature, which is less than the first temperature.

7 Claims, 1 Drawing Sheet

(56) References Cited

U.S. PATENT DOCUMENTS

| | | |
|---|---|---|
| 5,989,492 A | 11/1999 | Larsson |
| 6,306,680 B1 | 10/2001 | Fillion et al. |
| 2003/0082847 A1 | 5/2003 | Turner |
| 2005/0124140 A1 | 6/2005 | Mulligan |

OTHER PUBLICATIONS

Office Action relative to U.S. Appl. No. 11/941,609 dated Sep. 9, 2010.

Final Office Action relative to U.S. Appl. No. 11/941,609 dated Mar. 1, 2011.

* cited by examiner

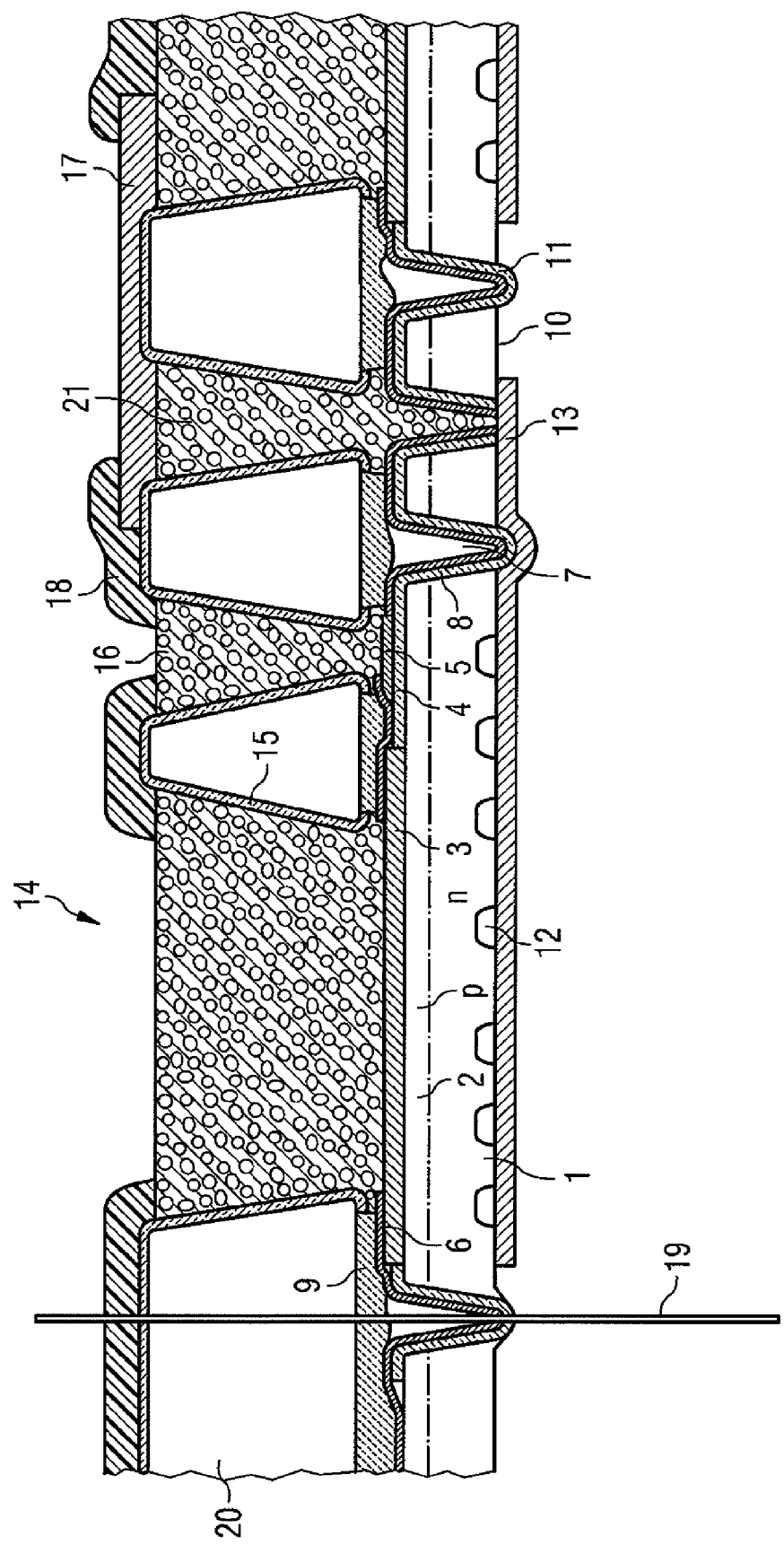

SEMICONDUCTOR DEVICE AND METHOD FOR PRODUCING SUCH A DEVICE

CROSS-REFERENCE TO RELATED APPLICATIONS

This Utility patent application is a divisional application of U.S. application Ser. No. 11/941,609, filed Nov. 16, 2007, and claims priority to German Patent Application No. DE 10 2006 054 311.4 filed on Nov. 17, 2006, which are incorporated herein by reference.

BACKGROUND

The invention relates to a method for producing a semiconductor device, and to a semiconductor device.

The complex production methods for modern semiconductor components and circuits include a multiplicity of processes which on the one hand for design reasons, that is to say with regard to the geometrical arrangement of component regions formed by the respective processes, should be performed in a specific sequence and on the other hand must be performed or should at least expediently be performed at respectively specific process temperatures. Reliable production methods having a high yield have had to be developed with regard to the mutual optimization of these two requirements.

Elevated requirements are being made of the technology since it has become established practice to form essential functional regions of semiconductor devices not only in the first main surface of a semiconductor wafer but indeed also in the opposite second main surface thereof, and since especially particularly thin semiconductor components and circuits have been employed industrially on a huge scale and have therefore became an object of mass production. This involves for example IGBTs (Insulated Gate Bipolar Transistors) or freewheeling diodes, for applications at high voltages of hundreds of volts, and also integrated circuit arrangements including such components. In the production of such semiconductor devices, handling poses particular problems, as is known, from the standpoint of the low mechanical stability.

For handling thin semiconductor wafers, as an intermediate product in the production of semiconductor devices with a small active substrate thickness, there have been a series of proposals, including for example soldering on a carrier or sacrificial wafer for mechanical stabilization.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates an embodiment of a semiconductor device

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIGURE(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide an improved production method for semiconductor devices which offers both for the problem of the low mechanical stability of thin semiconductor wafers and for the problem of ensuring a suitable method process sequence of the required processes—which in each case produce intermediate product states having limited temperature stability—a solution which can be implemented in mass production.

One or more embodiment include the combining the fitting of a carrier substrate on a functional wafer for the mechanical stabilization thereof with the concept of incorporating the carrier substrate in a process sequence that is ordered expediently according to the aspect of the thermal stability of specific intermediate states, without having to detach it again from the functional wafer. The embodiments furthermore includes shifting states of the processed functional wafer having relatively low temperature stability to the end of the process sequence, to be precise irrespective of that one of the two main surfaces on which the states are produced. In combination with providing the carrier substrate on the first main surface, this in turn leads to the feature of producing access openings to the functional wafer in the carrier substrate in a suitable manner for such "late" processes and of performing the processes in question—in one embodiment producing a front side metallization—through the access openings.

One or more embodiments include:

Patterned rear side high-temperature processes can be carried out using standard equipment.

The automatic production of front-side-aligned rear side alignment marks is possible.

Important areas of freedom are opened up in the production of the rear side metal.

The implementation of a metallic through-plating from front to rear side of the wafer is possible without any additional outlay.

The carrier replaces the galvanic phototechnology for the contacts on the wafer front side, and under certain circumstances the seed layer.

Any lamination and delamination during the thinning process becomes superfluous.

Patterned rear side contacts are possible, therefore also independent, vertical power transistors in an IC.

A reverse engineering of the circuits situated on the front side is very difficult.

In one embodiment, it is provided that the component production processes at the first main surface include performing at least a first diffusion process in the first main surface of the functional wafer at the first temperature for producing a whole-area or patterned front side diffusion zone. The production processes in which at least one component production process at the second main surface includes performing a diffusion process in the second main surface of the functional wafer at the first temperature for producing a whole-area or patterned rear side diffusion zone. These are then also referred to as semiconductor devices having diffusion zones on both sides or front and rear side diffusion zones.

The fact that one or more embodiments come to fruition here is due to the relatively high process temperatures of the diffusion processes after implantation processes, which are typically higher than the limit temperatures up to which metallization layers on the substrate surface are thermally stable. Insofar as the embodiments therefore enable the reliable performance of metallization processes on both substrate surfaces only after the conclusion of all the diffusion processes, it avoids damage to metallization structures as a result of diffusion processes that are to be performed later, and contributes to a high yield of the production process.

In a further embodiment, performing component production processes at the first main surface includes producing isolating trenches having a predetermined depth, which, in one embodiment, is greater than a predetermined end thickness of the semiconductor substrate of the semiconductor device. This is also referred to here, for instance in the case of high-voltage components, as a "vertical edge", that is to say that a pn junction is situated at the wall of an isolating trench between the individual semiconductor devices or chips. Specifically, producing the isolating trenches includes a passivation of the surface of the isolating trenches, by forming an oxide layer. Structures of this type are known and have also be marketable for some years in high-voltage semiconductor devices.

In a further embodiment, it is provided that applying an auxiliary nitride layer at least to essential regions of the first main surface is performed after the component production processes at the first main surface.

A further embodiment provides for the carrier substrate to be fitted to the first main surface of the functional wafer by using a binder layer and for the selective etching of the carrier substrate to include etching regions of the binder layer. In one embodiment, fitting the carrier substrate is performed with the use of a spin-on glass or a silicate solution as binder, in order to produce a connection that is intensely (up to more than 1000° C.), thermally stable. As already mentioned further above, applying the carrier substrate primarily serves the goal of mechanically stabilizing the functional wafer; it is therefore typically provided that thinning the functional wafer to a predetermined substrate thickness of the semiconductor device is performed after fitting the carrier substrate.

Another embodiment variant of the invention consists in the fact that at least one component production process at the second main surface is performed after the or at least one component production process at the first main surface, namely in the access openings, if the process temperature required during the process in the access openings, in one embodiment forming an insulating layer, lies above the first temperature. This should be seen in connection with the fact that the component production process at the second main surface can include applying a patterned rear side metallization to the second main surface of the functional wafer, and this rear side metallization typically does not withstand without damage the process temperatures customary for forming an insulating layer, specifically in a thermal manner.

In a further embodiment, it is provided that performing at least one further component production process at the first main surface includes forming a patterned front side metallization for the connection of functional regions of the semiconductor device in access openings of the carrier substrate. Specifically, forming the patterned front side metallization includes filling at least one portion of the access openings with a thick metal layer, the thickness of which is oriented to that of the carrier substrate (specifically carrier wafer).

In one embodiment it is provided that filling the access openings with the thick metal layer includes a first phase of introducing a granular and/or fibrous conductive primary filling and a second phase of electroplating the primary filling. Expediently, these processes are followed by thinning back the free surface of the carrier substrate for electrically separating contacts produced by the filling process. Unintentional electrical connections (contact bridges) produced by the preceding filling-in and switching-off process, which necessarily exhibits tolerances, are eliminated again by this process.

In a further embodiment of the carrier substrate, it is provided that a patterned surface metallization and/or a passivation layer is formed on the free surface of the carrier substrate after the at least one further component production process at the first main surface or the process of thinning back the free surface of the carrier substrate. The carrier substrate (or after singulation that section of the substrate which corresponds to the individual chip) therefore simultaneously acts as a wiring carrier.

In a further embodiment, it is provided that a portion of the access openings in the carrier substrate is produced in alignment with isolating trenches and/or other trenches in the functional wafer and later filled with metal. This is done, in one embodiment, in such a way as to produce an electrical through-plating of the free surface of the carrier substrate as far as the second main surface of the functional wafer or the semiconductor device. In combination with this last-mentioned variant, but in principle also independently thereof, it is possible to perform the separating—mentioned further above—into individual semiconductor devices in the isolating trenches.

To the abovementioned embodiments of the method there correspond largely also structural features of the semiconductor device that can be produced thereby. The mention made hereinafter of specific embodiments and aspects of the semiconductor device should therefore be regarded only as a selection.

In one embodiment, the carrier substrate is likewise a semiconductor substrate, in one embodiment a recycled semiconductor substrate from an earlier process cycle, such that the semiconductor device includes two semiconductor substrates that are fixedly connected to one another. From the substrates, the substrate which emerged from the functional wafer serves as substrate for all the essential component functions, wherein functional regions are provided on both main surfaces of this substrate. These include diffusion zones formed in both main surfaces and expediently also a rear side metallization of the functional substrate. As an alternative, the carrier substrate can be formed e.g., by a glass plate, in one embodiment with the coefficient of expansion adapted to the functional wafer.

In a further embodiment, it is provided that at least in a portion of the access openings, a thick metal layer is provided as connection region of component regions formed in/on the functional semiconductor substrate. In this embodiment, this connection metallization is formed in one embodiment as an electroplated granular and/or fibrous conductive structure.

In one embodiment, a solderable metallization for external connection of the semiconductor device is provided on the free main surface of the carrier substrate. In a further embodiment, a through-plating in trenches penetrating through the functional semiconductor substrate is formed between the thick metal layer in at least one portion of the access openings and the metallization on the second main surface.

In one or more embodiments, the semiconductor device is formed as a vertical semiconductor component having a small substrate thickness, in one embodiment of 100 μm or less and even more specifically of 50 μm or less. Specifically, this can involve a high-voltage switching element for switching voltages in the range of greater than 100 V, in one embodiment of 500 V or more, for instance an IGBT.

One embodiment of a method implementation (process flow) includes the following processes:

producing all front side structures up to immediately before the first, temperature-sensitive metallic layer on the front side, incl. the isolating trenches;

applying an auxiliary nitride layer;

bonding a silicon carrier with a spin-on glass;

thinning the product wafer until the isolating trenches appear;

carrying out all, including patterned, rear side dopings and diffusions;

controlled axial lifetime killing from the rear;

depositing a solderable rear side metal, if appropriate patterned;

producing a hard mask aligned with respect to the rear side on the front side;

etching the front side high-temperature carrier in the zones where metallic contacts are later intended to be fitted to the wafer front side;

etching the spin-on glass;

moist oxidation in order that a thick oxide arises at the walls of the etched silicon carrier, so as then to be able to selectively etch away the nitride auxiliary layer (in order to electrically insulate the individual later front side contacts from one another);

galvanically filling the openings in the carrier silicon with a metal, under certain circumstances also openings which lead through the entire stack as a result of superposition of the isolating trenches in the functional wafer and incipient etchings on the carrier wafer;

grinding or etching back the metal until the individual contact pads are insulated from one another again;

possibly applying a photoimide passivation.

The single FIG. 1 illustrates an example of a semiconductor device according to the invention (still in the assemblage of a semiconductor wafer and not to scale), and essential device elements and method processes for producing the state illustrated in the FIGURE are described briefly below.

On an n-type substrate (functional wafer) 1, a whole-area p-type diffusion 2 is performed on the front side (first main surface). The production of transistor cells 3 is indicated only schematically over the corresponding region. It reaches to directly before the source or anode metallization. After isolating trenches 7 have been produced, their surface is passivated with an oxide 8. A nitride 6 is deposited for reasons of later insulation of the contact pads.

A carrier wafer 20 is then bonded onto the front side of the functional wafer 1 with a spin-on glass 9. It is subsequently thinned to a thickness 10, the bottoms 11 of the isolating trenches 7 then appearing on the rear side (second main surface). (patterned) rear side diffusions 12 are performed in this configuration. The rear side subsequently receives an, if appropriate also patterned, metallization 13.

Afterward, the silicon of the carrier wafer is etched at contact locations 14, etching pits arising, and an insulating oxide 15 is produced by using a LOCOS process. The etching pits are then filled galvanically with a metal 16 having a thickness such that it simultaneously serves as a heat sink.

In this state, (optionally) wirings 17 are also produced on the surface, and passivations 18 are also implemented. Contacts from the underside to the top side of the circuits are produced at positions 21. Along positions 19, the chips are then singulated by the wafer saw.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device having a functional semiconductor substrate comprising:

a first and second main surface, having a diffusion zone formed in the second main surface and component functional regions formed at the first main surface and the second main surface;

wherein a carrier substrate is fitted to the first main surface of the functional semiconductor substrate, access openings to the first main surface being provided in the carrier substrate, a functional region of the semiconductor device being formed in each case in the access openings, wherein at least in a portion of the access openings, a thick metal layer is provided as connection region of a component region formed in/on the functional semiconductor substrate.

2. The semiconductor device of claim 1, comprising wherein a diffusion zone is formed in the first main surface.

3. The semiconductor device of claim 1, comprising wherein the thick metallization layer is formed as an electroplated granular and/or fibrous conductive structure.

4. The semiconductor device of claim 1, comprising wherein the connection between the functional semiconductor substrate and the carrier substrate has a spin-on glass or a silicate layer.

5. The semiconductor device of claim 1, comprising wherein a solderable metallization layer is provided on the second main surface of the functional semiconductor substrate and a through-plating in a trench penetrating through the functional semiconductor substrate is formed between the thick metal layer in at least one portion of the access openings and the metallization on the second main surface.

6. The semiconductor device of claim 1, formed as a vertical semiconductor component having a small substrate thickness of 50 μm or less.

7. The semiconductor device of claim 1, formed as a high-voltage switching element for switching voltages in the range of greater than 100 V.

* * * * *